(12) United States Patent
Chen et al.

(10) Patent No.: US 10,345,330 B2
(45) Date of Patent: Jul. 9, 2019

(54) MECHANICAL LOW PASS FILTER FOR MOTION SENSORS

(71) Applicant: Apple Inc., Cupertino, CA (US)

(72) Inventors: Kuan-Lin Chen, Sunnyvale, CA (US); Yun-Ju Lai, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 185 days.

(21) Appl. No.: 15/210,838

(22) Filed: Jul. 14, 2016

(65) Prior Publication Data

US 2017/0089943 A1    Mar. 30, 2017

Related U.S. Application Data

(63) Continuation-in-part of application No. 14/866,378, filed on Sep. 25, 2015.

(51) Int. Cl.
| | |
|---|---|
| *G01P 1/00* | (2006.01) |
| *G01P 15/00* | (2006.01) |
| *G01P 15/08* | (2006.01) |
| *G01C 19/5783* | (2012.01) |
| *B81B 7/00* | (2006.01) |

(52) U.S. Cl.
CPC ........ *G01P 15/0802* (2013.01); *B81B 7/0048* (2013.01); *G01C 19/5783* (2013.01); *G01P 1/003* (2013.01); *B81B 2201/0235* (2013.01); *B81B 2201/0242* (2013.01); *G01P 2015/0882* (2013.01); *H01L 2224/48091* (2013.01)

(58) Field of Classification Search
CPC ............................................. G01P 2015/0882
See application file for complete search history.

(56) References Cited

U.S. PATENT DOCUMENTS

| | | |
|---|---|---|
| 2002/0011117 A1 | 1/2002 | Orsier et al. |
| 2004/0255675 A1 | 12/2004 | Selvakumar et al. |
| 2008/0098814 A1 | 5/2008 | Platt |
| 2009/0320593 A1* | 12/2009 | Nakashio ........... G01C 19/5663 73/504.15 |
| 2012/0048018 A1 | 3/2012 | Hammer et al. |
| 2013/0194770 A1* | 8/2013 | Bernstein .............. B81B 7/0016 361/808 |
| 2013/0199295 A1 | 8/2013 | Hoefer et al. |
| 2014/0352431 A1 | 12/2014 | Leclerc et al. |
| 2015/0346232 A1 | 12/2015 | Pruksch et al. |
| 2016/0291050 A1 | 10/2016 | Ehrenpfordt et al. |

* cited by examiner

*Primary Examiner* — Son T Le
*Assistant Examiner* — Herbert K Roberts
(74) *Attorney, Agent, or Firm* — Fish & Richardson P.C.

(57) ABSTRACT

Mechanical low pass filters for motion sensors and methods for making the same are disclosed. In an implementation, a motion sensor package comprises: a substrate; one or more viscous dampers formed on the substrate; one or more mechanically compliant metal springs formed on the substrate; and a sensor stack attached to the one or more metal springs, the sensor stack overlying the one or more viscous dampers and forming a gap between the sensor stack and the one or more viscous dampers and channels between the one or more viscous dampers and metal springs, wherein the one or more metal springs and the one or more viscous dampers provide a mechanical suspension system having a resonant frequency that is higher than a sensing bandwidth of a motion sensor in the sensor stack and lower than a resonant frequency of the motion sensor.

18 Claims, 16 Drawing Sheets

MECHANICAL LOW PASS FILTER FOR MOTION SENSORS

CROSS-REFERENCE TO RELATED APPLICATION

This application is a continuation-in-part of and claims priority to U.S. patent application Ser. No. 14/866,378, filed Sep. 25, 2015, the entire contents of which are incorporated herein by reference.

TECHNICAL FIELD

This disclosure relates generally to integrated circuit (IC) packaging.

BACKGROUND

Motion sensors in consumer electronics are subjected to interference due to their integration into compact and highly complex systems, such as smart phones, electronic tablets and wearable devices. In particular, mechanical vibrations from speakers, vibrators or other system components can impact the desired motion signal by inducing noise and error in the motion sensor output. Moreover, the resonance behaviors of the motion sensor can amplify the mechanical vibrations further increasing the noise and error in motion sensor output. A conventional approach to address this issue is to implement an electrical low-pass filter at the output of the sensor to attenuate the signal that is out of a defined bandwidth (BW) of the motion sensor. The electrical low-pass filter, however, may not be sufficient and consumes power which limits its utility in low power applications.

SUMMARY

Mechanical low pass filters for motion sensors and methods for making the same are disclosed.

In an implementation, a motion sensor package comprises: a substrate; one or more viscous dampers formed on the substrate; one or more mechanically compliant metal springs formed on the substrate; and a sensor stack attached to the one or more metal springs, the sensor stack overlying the one or more viscous dampers and forming a gap between the sensor stack and the one or more viscous dampers and channels between the one or more viscous dampers and metal springs, wherein the one or more metal springs and the one or more viscous dampers provide a mechanical suspension system having a resonant frequency that is higher than a sensing bandwidth of a motion sensor in the sensor stack and lower than a resonant frequency of the motion sensor.

In an implementation, a method of fabricating a mechanical suspension system with viscous dampers comprises: (a) depositing a sacrificial material with a defined thickness on a surface of a substrate; (b) patterning the sacrificial material; (c) depositing a seed layer onto the surface and the sacrificial layer; (d) depositing a first photoresist layer onto the seed layer; (e) patterning the first photoresist layer to define a spring pattern; (f) forming a first metal layer of a first defined thickness onto the seed layer to form a metal spring; (g) removing the first photoresist layer; (h) depositing a second photoresist layer on the seed layer and the metal spring; (i) patterning the second photoresist layer to define a viscous damper pattern; (j) forming a second metal layer of second defined thickness onto the seed layer to form viscous dampers; (k) grinding or milling a resulting structure fabricated by the preceding steps (a)-(j) to create a flat surface on the resulting structure; (l) removing the second photoresist layer and the seed layer from the resulting structure; and (m) removing the sacrificial layer from the resulting structure to release the metal spring.

In an implementation, an apparatus comprises: a motion sensor including: a substrate; one or more viscous dampers formed on the substrate; one or more mechanically compliant metal springs formed on the substrate; a sensor stack attached to the one or more metal springs, the sensor stack overlying the one or more viscous dampers and forming a gap between the sensor stack and the one or more viscous dampers and channels between the one or more viscous dampers and metal springs, wherein the one or more metal springs and the one or more viscous dampers provide a mechanical suspension system having a resonant frequency that is higher than a sensing bandwidth of a motion sensor in the sensor stack and lower than a resonant frequency of the motion sensor; a processor coupled to the motion sensor; memory coupled to the processor and configured to store instructions, which when executed by the processor, causes the processor to perform operations comprising: obtaining a motion signal from the motion sensor; and determining one or more of position, velocity, speed or orientation of the apparatus based at least in part on the motion signal.

Particular implementations disclosed herein provide one or more of the following advantages. A mechanical low pass filter utilizing a mechanical suspension system is built into a sensor package. The mechanical suspension system isolates the motion sensor from out-of-band vibration and package strain and improves sensor stability. In an embodiment, viscous dampers (e.g., air dampers) are used to provide small gaps and/or channels filled with air, gas or liquid that can be used in place of, or together with, mechanically compliant dampers to achieve a mechanical suspension system that has a desired resonant frequency range (e.g., between 500 Hz to 1 kHz) and quality Q (e.g., less than 1).

The details of the disclosed implementations are set forth in the accompanying drawings and the description below. Other features, objects and advantages are apparent from the description, drawings and claims.

DESCRIPTION OF DRAWINGS

The same reference symbol used in various drawings indicates like elements.

DETAILED DESCRIPTION

The disclosed implementations provide a mechanical low-pass filter for motion sensors to attenuate out-of-band vibrations (i.e., outside the bandwidth of the motion sensor). In some implementations, the mechanical low-pass filter is built into the package of the motion sensor by creating a mechanically compliant suspension system to attenuate vibration. The mechanically compliant suspension system is designed to have a resonant frequency that is higher than the sensing bandwidth of the motion sensor ($f_{sensor}$) but lower than the resonant frequency of the motion sensor (represented by response curve 102). In the examples that follow, the motion sensor is a micro-electrical-mechanical system (MEMS). Some example MEMS are a MEMS accelerometer for sensing acceleration and a MEMS gyro for sensing rotation rate.

Figure 1:
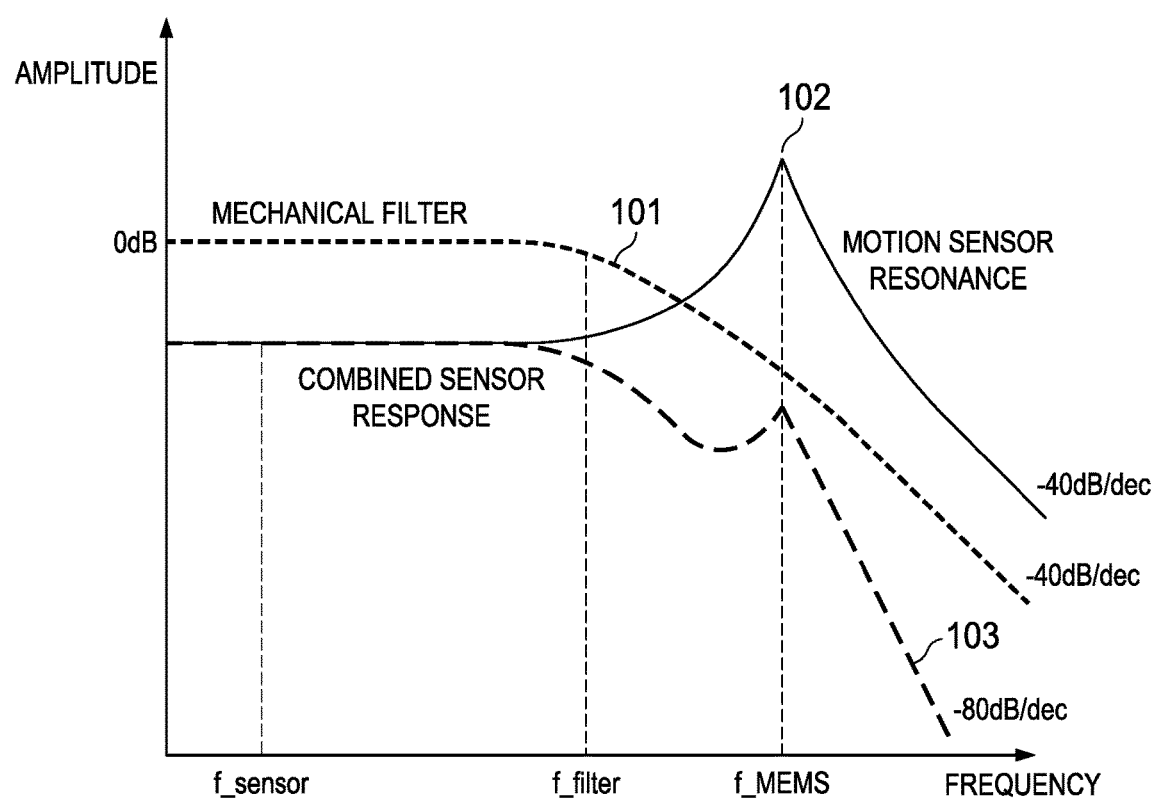
FIG. 1 is a plot showing frequency responses of a motion sensor, a mechanical filter and a combined sensor and filter.

FIG. 1 is a plot showing frequency responses 101, 102, 103 of a mechanical low pass filter, motion sensor and a combined sensor and mechanical filter, respectively. The mechanical suspension system disclosed herein and that is used to create the low-pass filter will provide a −40 dB/dec attenuation after input frequencies (vibration frequencies) pass the resonant frequency of the filter ($f_{filter}$). The combined sensor plus filter frequency response (represented by frequency response curve 103) will have an attenuated resonant peak at the resonant frequency of the motion sensor ($f_{MEMS}$). The combined sensor and filter frequency response (curve 103) has a steeper roll-off (−80 dB/dec) after $f_{MEMS}$. Moreover, the compliance of the mechanical suspension system will absorb most of the strain caused by the assembly process of the motion sensor package and improve the motion sensor stability.

Figure 2A:
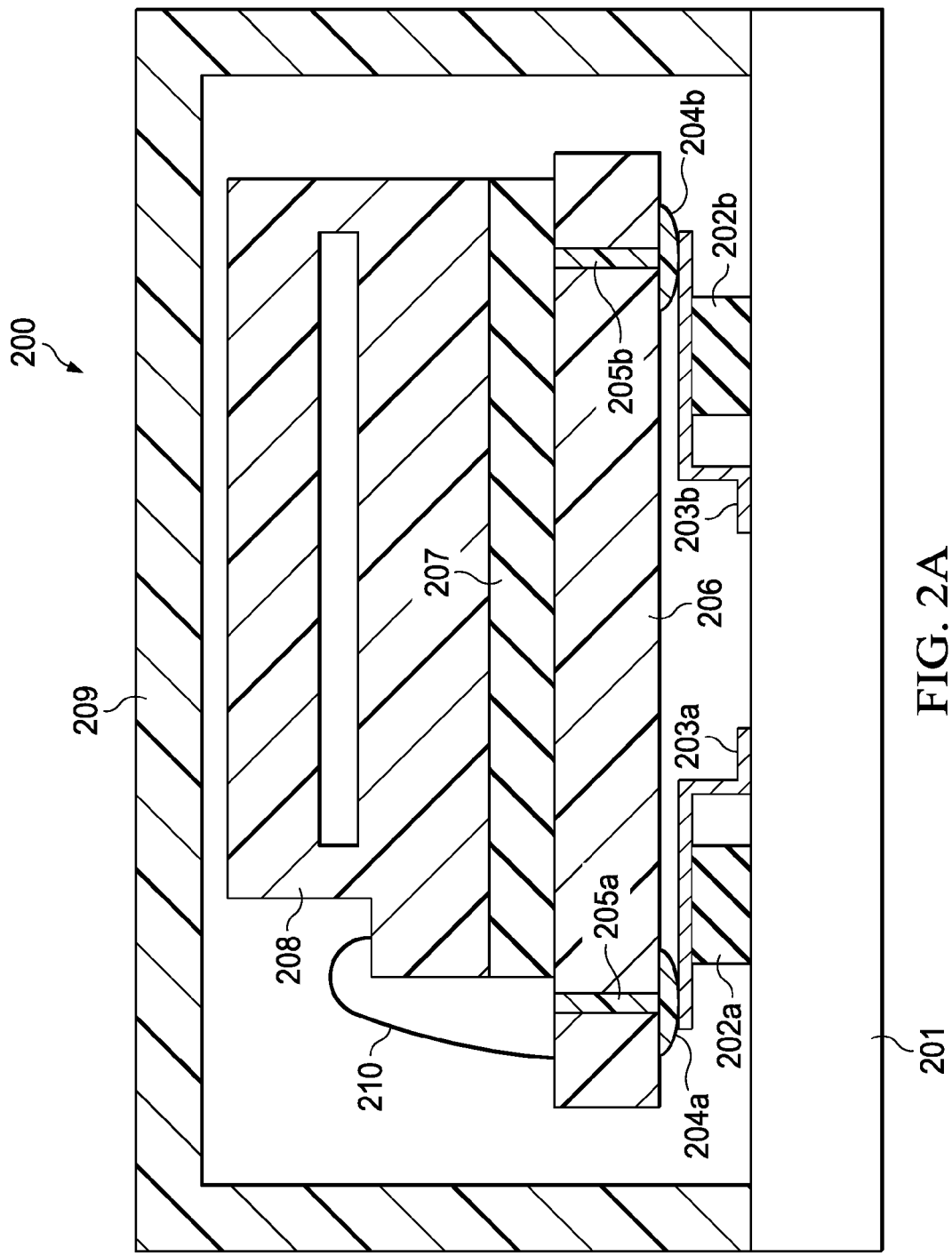
FIGS. 2A and 2B are cross-section views of example configurations of a mechanical low pass filter with mechanically compliant dampers assembled into a package.
Figure 2B:
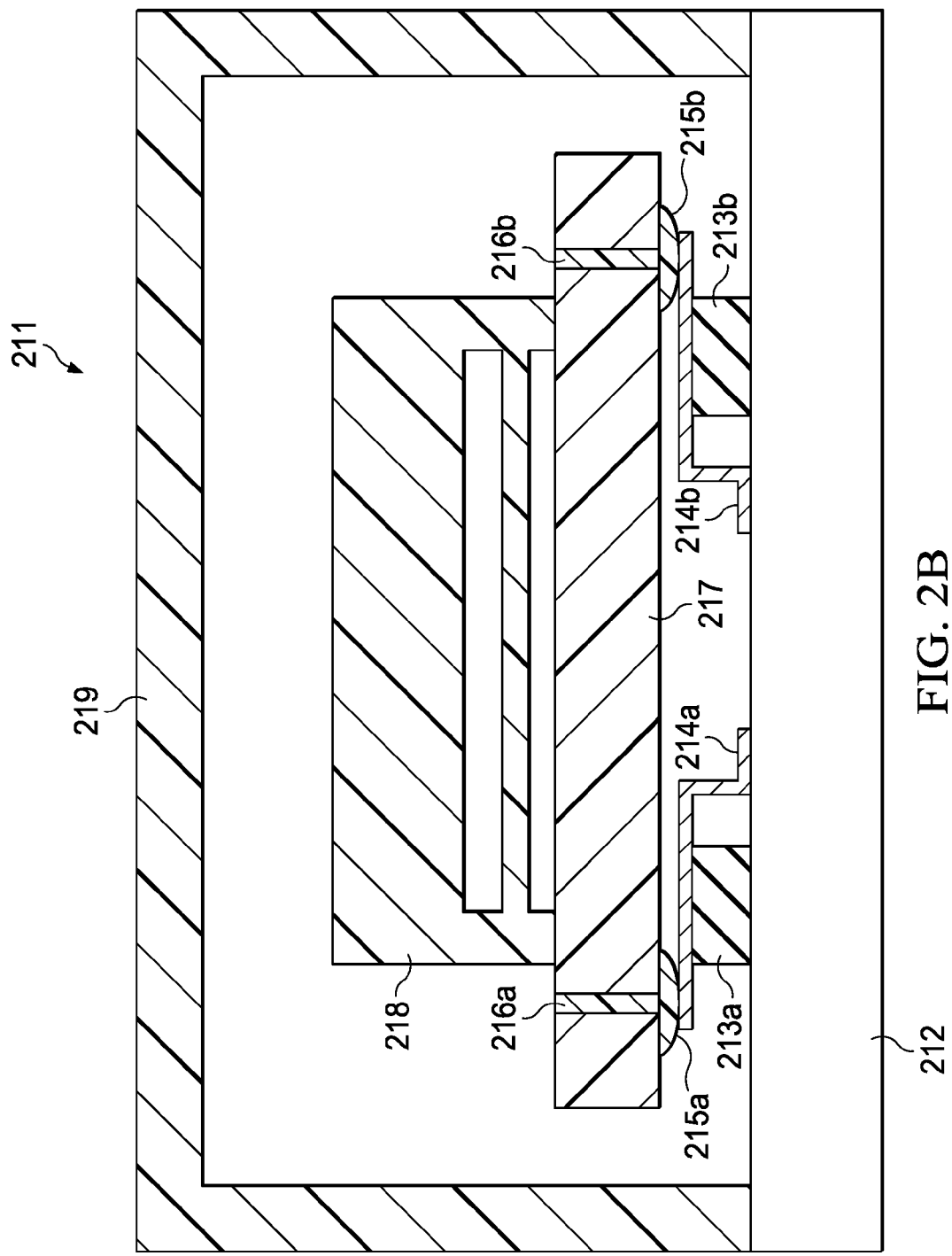

FIGS. 2A and 2B are cross-section views of example configurations of a mechanical low pass filter assembled into a package. FIG. 2A shows an example two-die MEMS device, where MEMS die 208 and an application specific integrated circuit (ASIC) die 206 are assembled into package 200. MEMS die 208 and ASIC die 206 are connected using bond wire 210. FIG. 2B shows an example single-die MEMS device, where MEMS 218 and integrated circuit 217 are monolithically integrated into a single die which is then assembled into package 211. A bond wire is not required to connect MEMS 218 to ASIC 217. Package 200 and 211 provide the functions of mechanical suspension and electrical connection in metal springs 203 and 214 and it is better suited for devices with only a few electrical connections to the solder pads of package 200 and 211.

Referring to FIG. 2A, in some implementations package 200 includes substrate 201 (e.g., a ceramic substrate), mechanically compliant dampers 202, metal springs 203, solder bumps 204, integrated circuit die 206, shock absorbing die-attachment film (DAF) 207, MEMS die 208 and package cover 209. The combination of integrated circuit die 206, DAF 207 and MEMS die 208 are also referred to herein as a sensor stack. The overall stiffness and quality factor Q of the mechanical suspension system is determined by the designs of metal springs 203 and mechanically compliant dampers 202. The damping coefficient is determined by the material properties, design and location of dampers 202 on substrate 201. Metal springs 203 can be shaped in a variety of ways as shown in FIGS. 5A-5H to achieve the desired low-pass filter characteristics shown in FIG. 1. Bond wire 210 electrically connects MEMS die 208 to integrated circuit die 206.

In this example implementation, metal springs 203 serve as both the mechanical suspension and electrical connection to package 200. In some implementations, through silicon vias (TSVs) 205 can be formed in integrated circuit die 206 to electrically connect integrated circuit die 206 to metal springs 203 through solder bumps 204. Metal springs 203 can be electrically coupled to package pads (not shown) to allow signals from integrated circuit die 206 to be output on one or more pins (not shown) of package 200.

Referring to FIG. 2B, in some implementations package 211 includes substrate 212 (e.g., a ceramic substrate), mechanically compliant dampers 213, metal springs 214, solder bumps 215, integrated circuit 217, MEMS 218 and package cover 219. MEMS 218 and integrated circuit 217 are monolithically integrated into a single die which is then assembled into package 211. The single die is also referred to herein as a sensor stack. The overall stiffness and quality factor of the mechanical suspension system is determined by the designs of metal springs 214 and mechanically compliant dampers 213. The damping coefficient is determined by the material properties, design and location of dampers 213 on substrate 212. Metal springs 214 can be shaped in a variety of ways as shown in FIGS. 5A-5H to achieve the desired low-pass filter characteristics shown in FIG. 1.

In this example implementation, metal springs 214 serve as both the mechanical suspension and electrical connection to package 211. In some implementations, through silicon vias (TSVs) 216 can be formed in integrated circuit die 217 to electrically connect integrated circuit die 217 to metal springs 214 through solder bumps 215. Metal springs 214 can be electrically coupled to package pads (not shown) to allow signals from integrated circuit die 217 to be output on one or more pins (not shown) of package 211.

Figure 3:
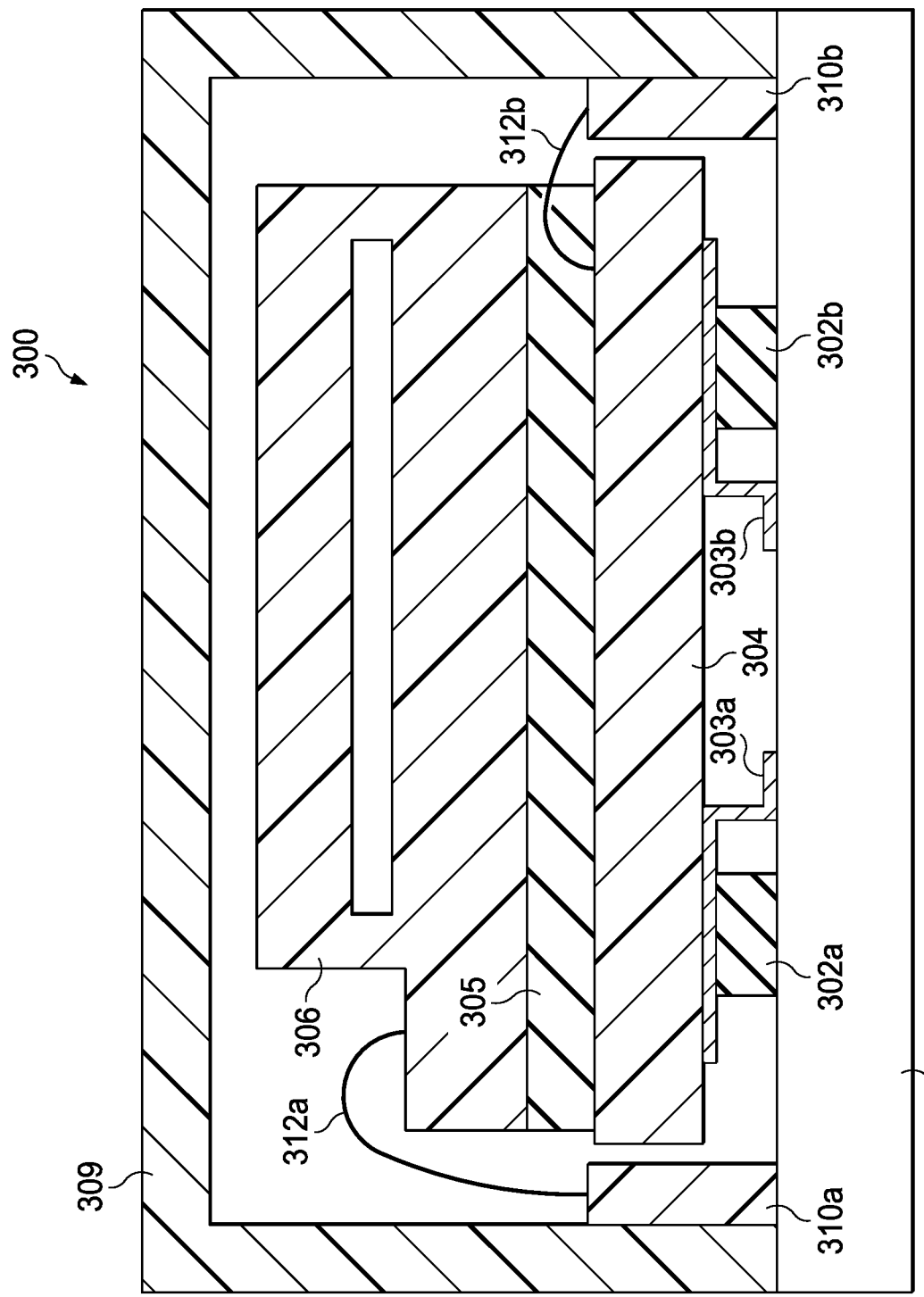
FIG. 3 is a cross-section view of an example alternate mechanical low pass filter with mechanically compliant dampers assembled into a package.

FIG. 3 is a cross-section view of a second example implementation of a mechanical low pass filter assembled into a package. Package 300 is better suited for devices with many electrical connections to the solder pads of package 300. In some implementations, package 300 includes substrate 301 (e.g., a ceramic substrate), mechanically compliant dampers 302, metal springs 303, integrated circuit die 304, shock absorbing DAF 305, MEMS 306 and package cover 309. Like package 200, the overall stiffness and quality factor Q of the mechanical suspension system shown in FIG. 3 is determined by the designs of both metal springs 303 and dampers 302. The damping coefficient is determined by the design and location of dampers 302 on substrate 301. Metal springs 303 can be shaped in a variety of ways as shown in FIGS. 5A-5H to achieve the desired low-pass filter characteristics shown in FIG. 1. In some implementations, metal springs 303 are attached to integrated circuit die 304 by solder, conductive epoxy or silicone.

Unlike package 200, metal springs 303 are only used for mechanical suspension and not for electrical connections with package pads 310. In some implementations, wire bonds 312 electrically couple MEMS 306 and integrated circuit die 304 to package pads 310.

Figure 4A:
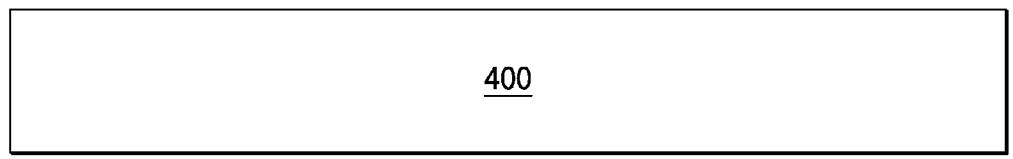
FIGS. 4A-4H are an example process flow for fabricating the mechanical suspension system with mechanically compliant dampers shown in FIGS. 2 and 3.
Figure 4B:
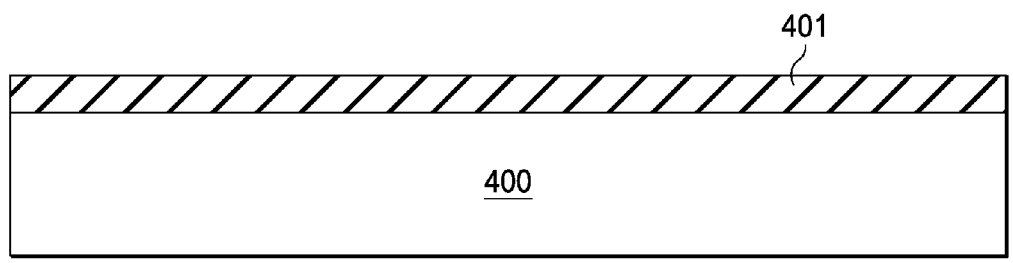
Figure 4C:
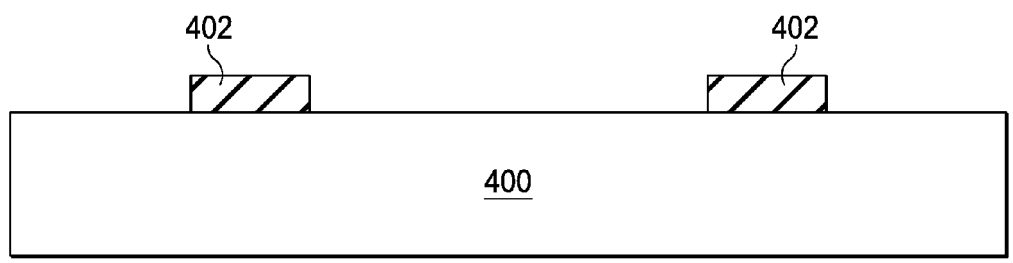

FIGS. 4A-4H are an example process flow for fabricating the mechanical suspension system shown in FIGS. 2 and 3. Referring to FIG. 4A, the process flow begins with a silicon wafer or general package substrate 400. Damping material 401 is dispensed on the top surface of wafer or substrate 400 with a defined thickness, as shown in FIG. 4B. Damping material 401 can be cured at an appropriate temperature. Damping material 401 is then patterned using, for example, a $CO_2$ laser to form dampers 402, as shown in FIG. 4C.

Figure 4D:
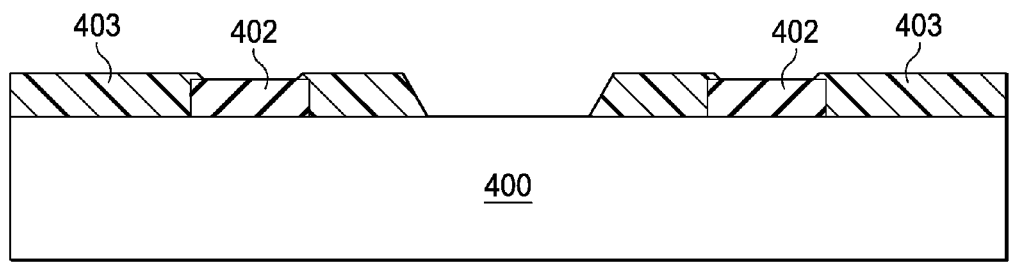

First photoresist layer 403 is deposited on the top surface of damping material 401 with a thickness that is greater than a thickness of damping material 401, as shown in FIG. 4D. First photoresist layer 403 is then patterned by photolithography technology to define opening areas. First photoresist layer 403 is then developed to etch away unwanted areas.

Figure 4E:
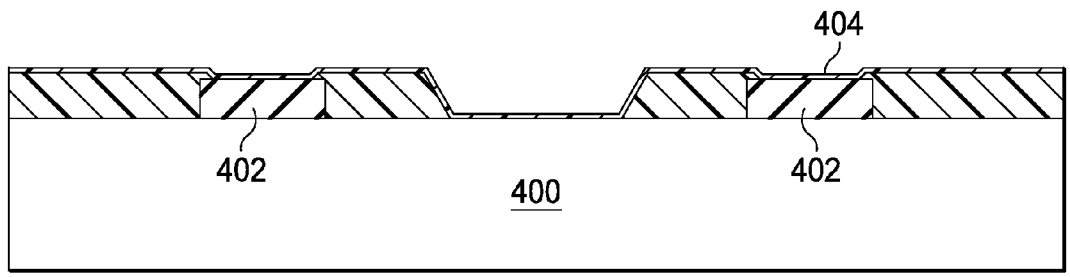
Figure 4F:
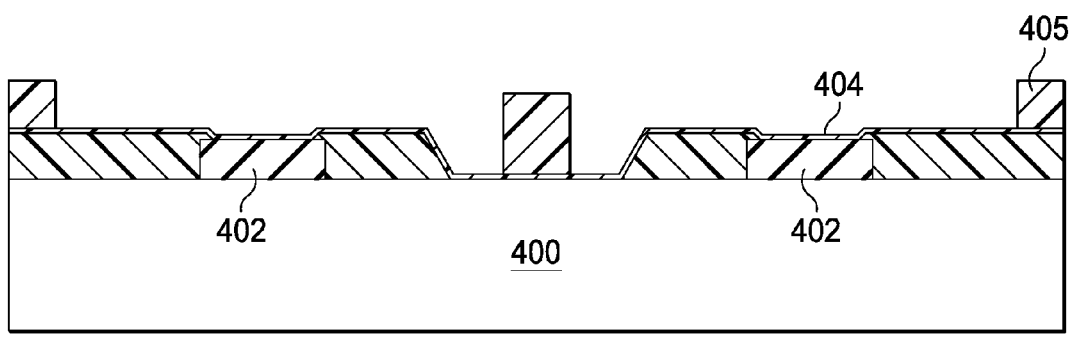

Seed layer 404 is deposited by physical vapor deposition (PVD) onto the top surface first photoresist layer 403, as shown in FIG. 4E. Second photoresist layer 405 is deposited on seed layer 404, as shown in FIG. 4F. The same lithographic technique used with first photoresist layer 403 is used with second photoresist layer 405 to define one or more metal spring patterns.

Figure 4G:
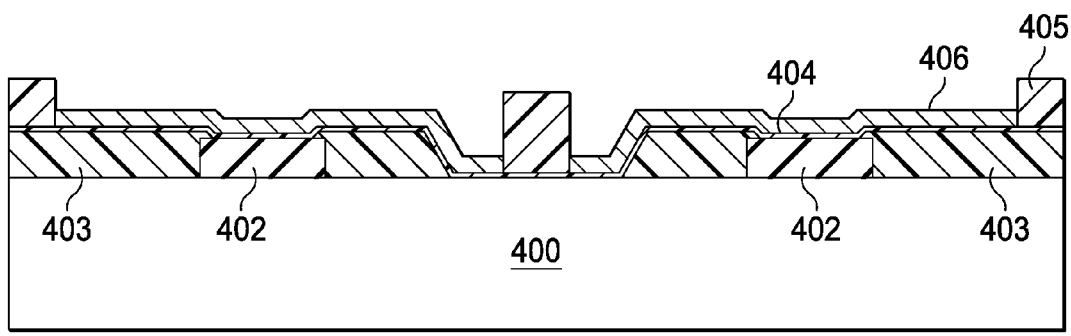
Figure 4H:
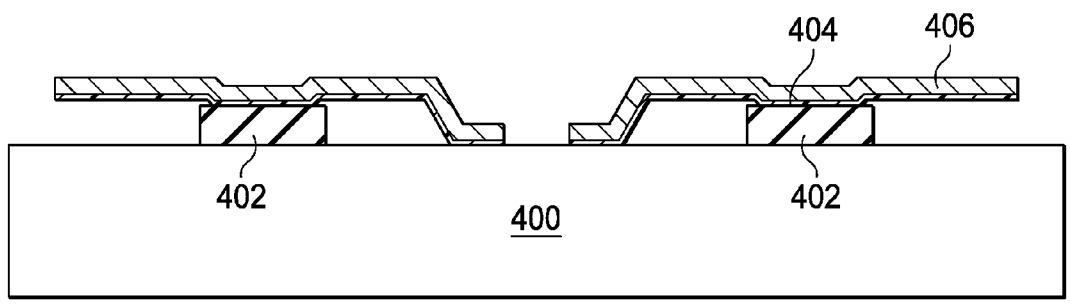

Metal layer 406 of defined thickness is electrode-plated onto seed layer 404 to form the metal spring. Second photoresist layer 405 is removed by chemical etching and seed layer 404 is removed by sputtering or chemical etching, as shown in FIG. 4G. Lastly, first photoresist layer 403 is removed to release the metal spring, as shown in FIG. 4H.

Figure 5A:
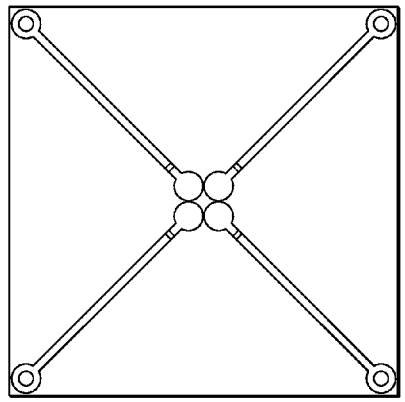
FIGS. 5A-5H are example metal spring patterns that provide the desired mechanical filter frequency response shown in FIG. 1.
Figure 5B:
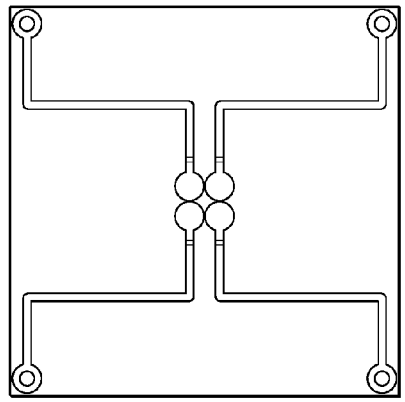
Figure 5C:
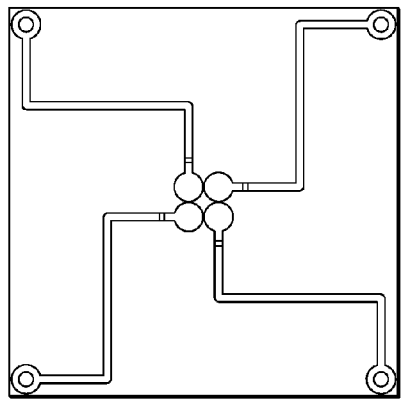
Figure 5D:
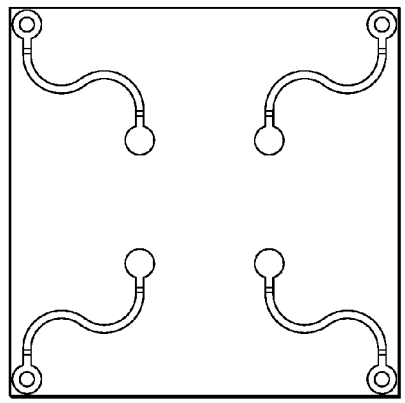
Figure 5E:
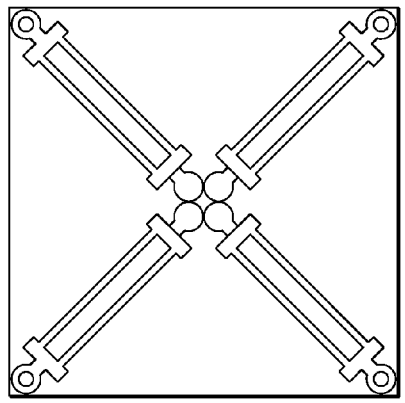
Figure 5F:
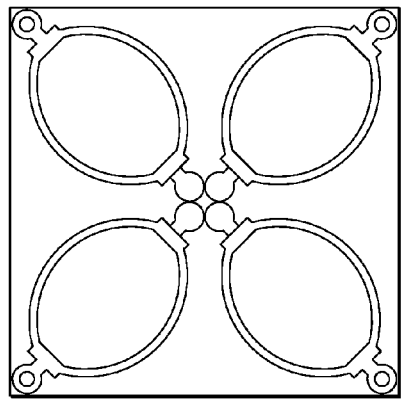
Figure 5G:
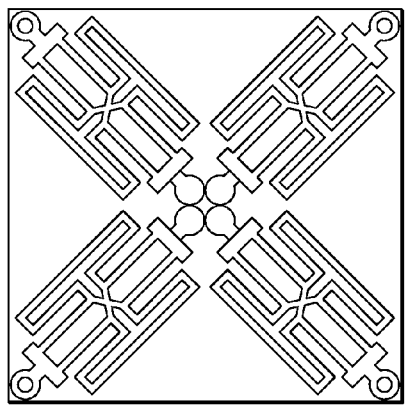
Figure 5H:
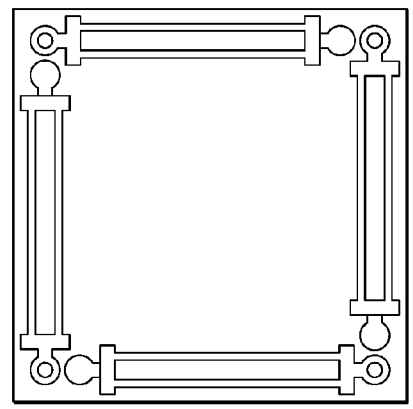

FIGS. 5A-5H are example metal spring patterns that help provide the desired mechanical filter frequency response shown in FIG. 1. A variety of metal spring patterns can be used to obtain the filter characteristics shown in FIG. 1. The example patterns shown in FIGS. 5A-5H were simulated using motion sensor silicon dimensions as the device to be vibration isolated to achieve the desired filter characteristics shown in FIG. 1, where the mechanical suspension system has a resonant frequency higher than the motion sensor bandwidth (e.g., 500 Hz) but lower than the resonant frequency (e.g., 1 KHz) of the motion sensor. Some examples of metal spring patterns that provide the desired filter characteristics include radial straight beam (FIG. 5A), radial L-shaped beam (FIG. 5B), radial asymmetric L-shaped beam (FIG. 5C), radial S-shaped beam (FIG. 5D), radial dual beam (FIG. 5E), radial curved dual beam (FIG. 5F), radial folded beam (FIG. 5G) and peripheral dual beam (FIG. 5H). Other metal spring patterns may also be used provided they can provide the desired filter characteristics.

Figure 6:
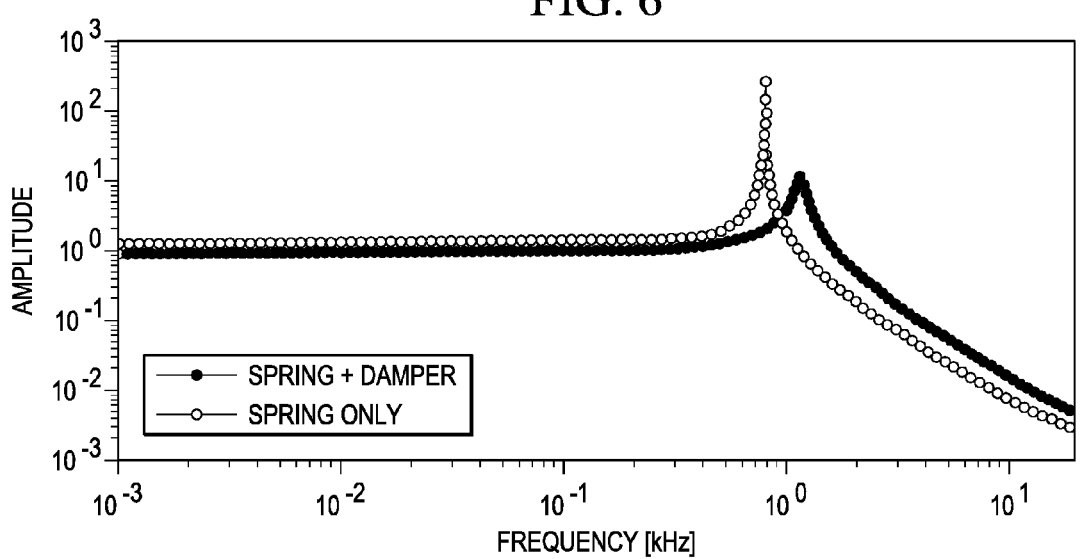
FIG. 6 is a plot showing example frequency responses of a simulated mechanical suspension system that includes only metal springs and a simulated mechanical suspension system that includes metal springs and mechanically compliant dampers.

FIG. 6 is a plot showing example frequency responses of a simulated mechanical suspension system that includes only metal springs and a simulated mechanical suspension system that includes metal springs and mechanically compliant dampers. In these example simulations, the mechanical suspension systems include metal springs with radial L-shaped beam patterns, as shown in FIG. 5B. As shown by the plot, the mechanical suspension system with only the metal spring (no dampers) has a resonant frequency at about 786 Hz. When the damper is incorporated, the resonant frequency can increase to about 1131 Hz, but the vibration amplitude is greatly attenuated at resonant frequency resulting in a quality factor of about 11.6.

Figure 7:
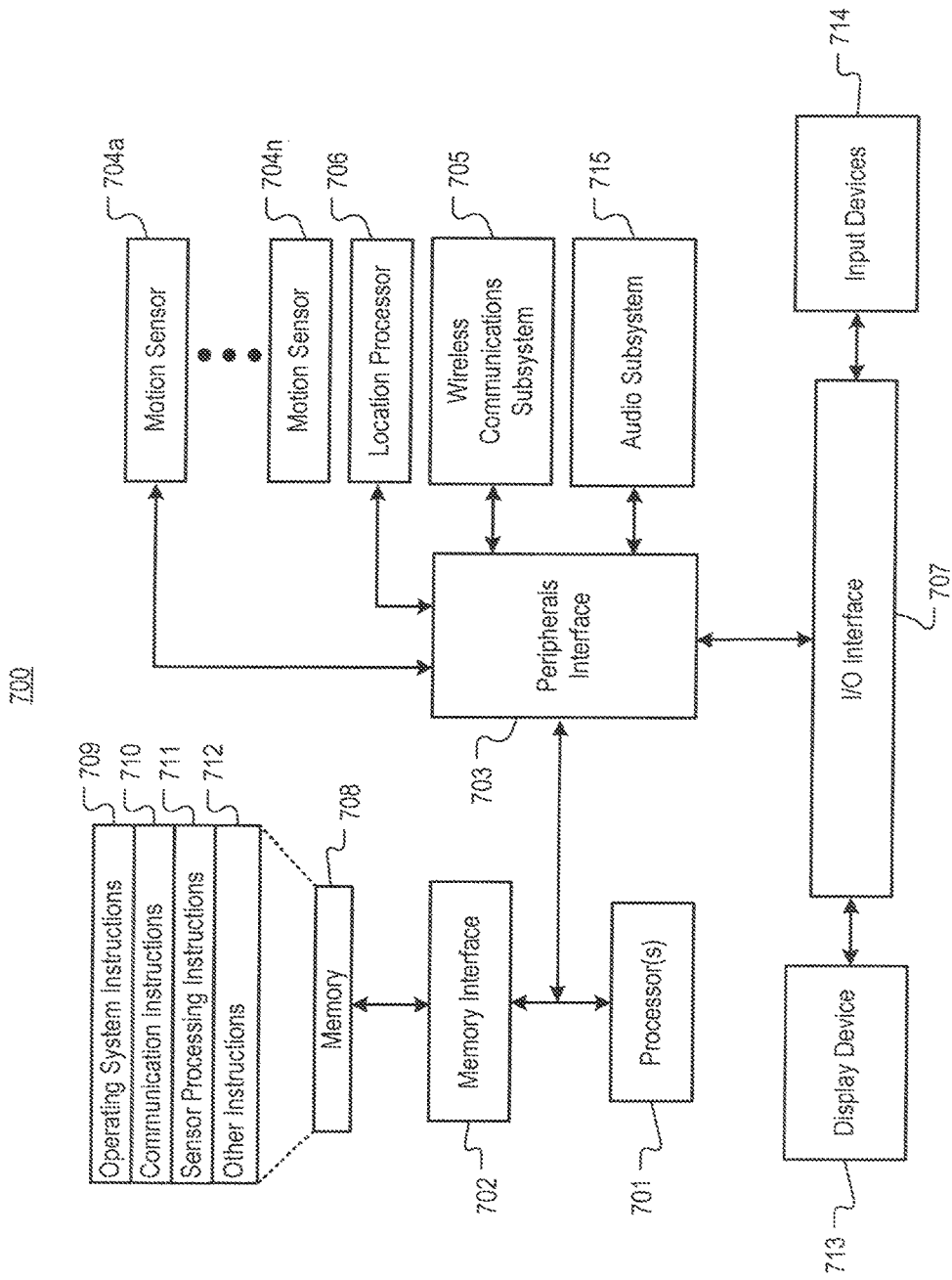
FIG. 7 is example apparatus that includes a motion sensor as described in reference to FIGS. 1-6.

FIG. 7 is an example apparatus that includes one or more motion sensors, as described in reference to FIGS. 1-6. In some implementations, motion sensor packages 200, 300, 800 can be implemented in an apparatus, such as smart phone, tablet computer, wearable computer and the like. The apparatus can have a system architecture 700 that includes processor(s) 701, memory interface 702, peripherals interface 703, one or more motion sensors 704a-704n, wireless communication subsystem 705, audio subsystem 715, Input/Output (I/O) interface 707, memory 708, display device 713 and input devices 714.

Motion sensors 704a-704n (e.g., MEMS accelerometer, MEMS gyroscope) may be coupled to peripherals interface 703 to facilitate multiple motion sensing functionalities of the apparatus. Location processor 706 can include a global navigation satellite system (GNSS) receiver. Wireless communications subsystem 705 may include radio frequency (RF) receivers and transmitters (or RF transceivers) and/or optical (e.g., infrared) receivers and transmitters. Wireless communication subsystem 705 can operate over a variety of networks, such as global system for mobile communications (GSM) network, GPRS network, enhanced data GSM environment (EDGE) network, IEEE 802.xx network (e.g., Wi-Fi, Wi-Max, ZigBee™), 3G, 4G, 4G LTE, code division multiple access (CDMA) network, near field communication (NFC) network, Wi-Fi Direct network and Bluetooth™ network.

I/O interface 707 may include circuitry and/or firmware for supporting wired mediums and implement various communication protocols and include ports for UART, Serial, USB, Ethernet, RS-232 and the like.

Memory interface 702 is coupled to memory 708. Memory 708 may include high-speed random access memory or non-volatile memory, such as one or more magnetic disk storage devices, one or more optical storage devices, or flash memory (e.g., NAND, NOR). Memory 708 may store operating system 709, such as Darwin, RTXC, LINUX, UNIX, OS X, iOS, WINDOWS, or an embedded operating system such as VxWorks. Operating system 709 may include instructions for handling basic system services and for performing hardware dependent tasks. In some implementations, operating system 709 may include a kernel (e.g., UNIX/LINUX kernel).

Memory 708 may also store communication instructions 710 to facilitate communicating with one or more additional devices in a network topology and one or more computers or servers over wired and wireless mediums. Communication instructions 710 can include instructions for implementing all or part of a wireless communications software stack.

Memory 708 may include sensor processing instructions 711 to facilitate motion sensor-related processing and functions on motion signals received from motion sensors 704a-704n.

Other instructions 712 can include instructions for a variety of applications that use the motion signals provided by motion sensors 704a-704n. For example, other instructions can include application instructions that take the motion signals from motion sensors 704a-704n and compute the current location, speed and orientation of the apparatus in a reference coordinate frame (e.g., geodetic, local level). The application instructions can display a map on display device 713 with a marker indicating the location of the apparatus along with other information such as turn-by-turn directions for a route. Audio subsystem 715 can provide speech output for the application that provides, for example, audible turn-by-turn directions.

Other applications can make other uses of motion signals from motion sensors 704a-704n and will benefit from motion signals that are less noisy and have less errors due to the mechanical filter designs disclosed herein. For example, an electronic pedometer application can benefit from improved motion signals provided by the mechanical filter designs disclosed herein.

Figure 8:
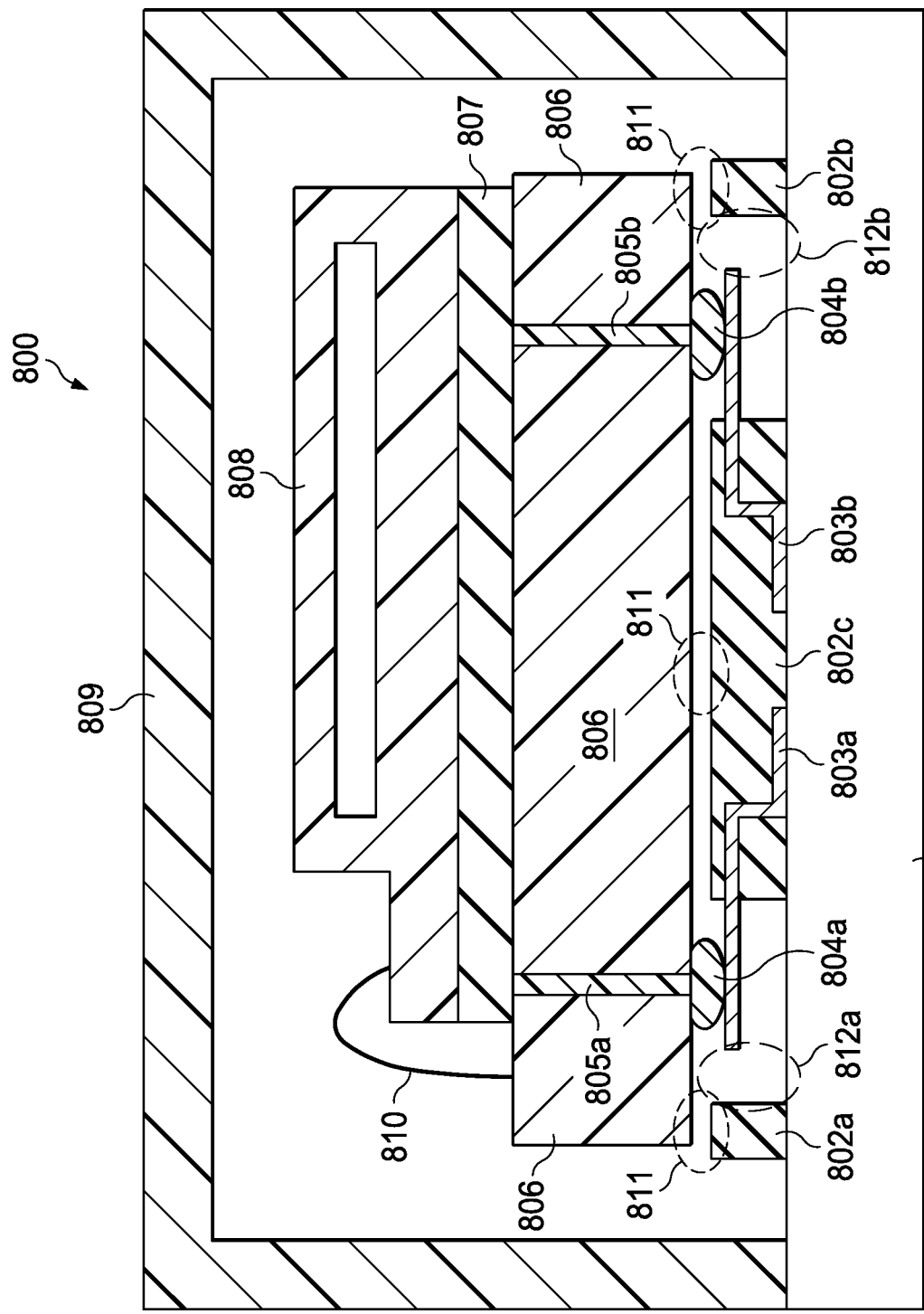
FIG. 8 is a cross-section view of an example configuration of a mechanical low pass filter with viscous dampers assembled into a package.

FIG. 8 is a cross-section view of an example configuration of a mechanical low pass filter with viscous dampers assembled into a package. A viscous damper can use air and/or any gases and/or liquids with suitable viscosities. In some implementations package 800 includes substrate 801 (e.g., a ceramic substrate), viscous dampers 802, metal springs 803, solder bumps 804, integrated circuit die 806, shock absorbing die-attachment film (DAF) 807, MEMS die 808 and package cover 809. The combination of integrated circuit die 806, DAF 807 and MEMS die 808 are also referred to herein as a sensor stack. The overall stiffness and damping coefficient of the mechanical suspension system are determined by the designs of metal springs 803 and viscous dampers 802, respectively. Bond wire 810 electrically connects MEMS die 808 to integrated circuit die 806.

In this example implementation, metal springs 803 serve as both the mechanical suspension and electrical connection to package 800. In some implementations, TSVs 805 can be formed in integrated circuit die 806 to electrically connect integrated circuit die 806 to metal springs 803 through solder bumps 804. Metal springs 803 can be electrically coupled to package pads (not shown) to allow signals from integrated circuit die 806 to be output on one or more pins (not shown) of package 800.

Package 800 is an alternative design to mechanically compliant dampers that achieves or improves the overall damping for mechanical suspension based on viscous damping effects. In some implementations, viscous dampers 802 can be used in place of, or together with, mechanically compliant dampers 202 shown in FIG. 2A. In package 800, metal springs 803 do not have physical contact with viscous dampers 802. Rather, viscous dampers 802 create small vertical gaps 811 to the bottom side of the sensor stack and channels 812 around metal springs 803. As a result, the movement of MEMS die 808 driven by external vibrations would experience damping due to squeeze film, slide film and viscous drag. With hermetic sealing of package 800, the damping coefficient is determined by the gap height, surface area and roughness between one or more viscous dampers and the sensor stack, and the channel width and length. The damping coefficient can be further optimized with the sealing pressure.

Figure 9:
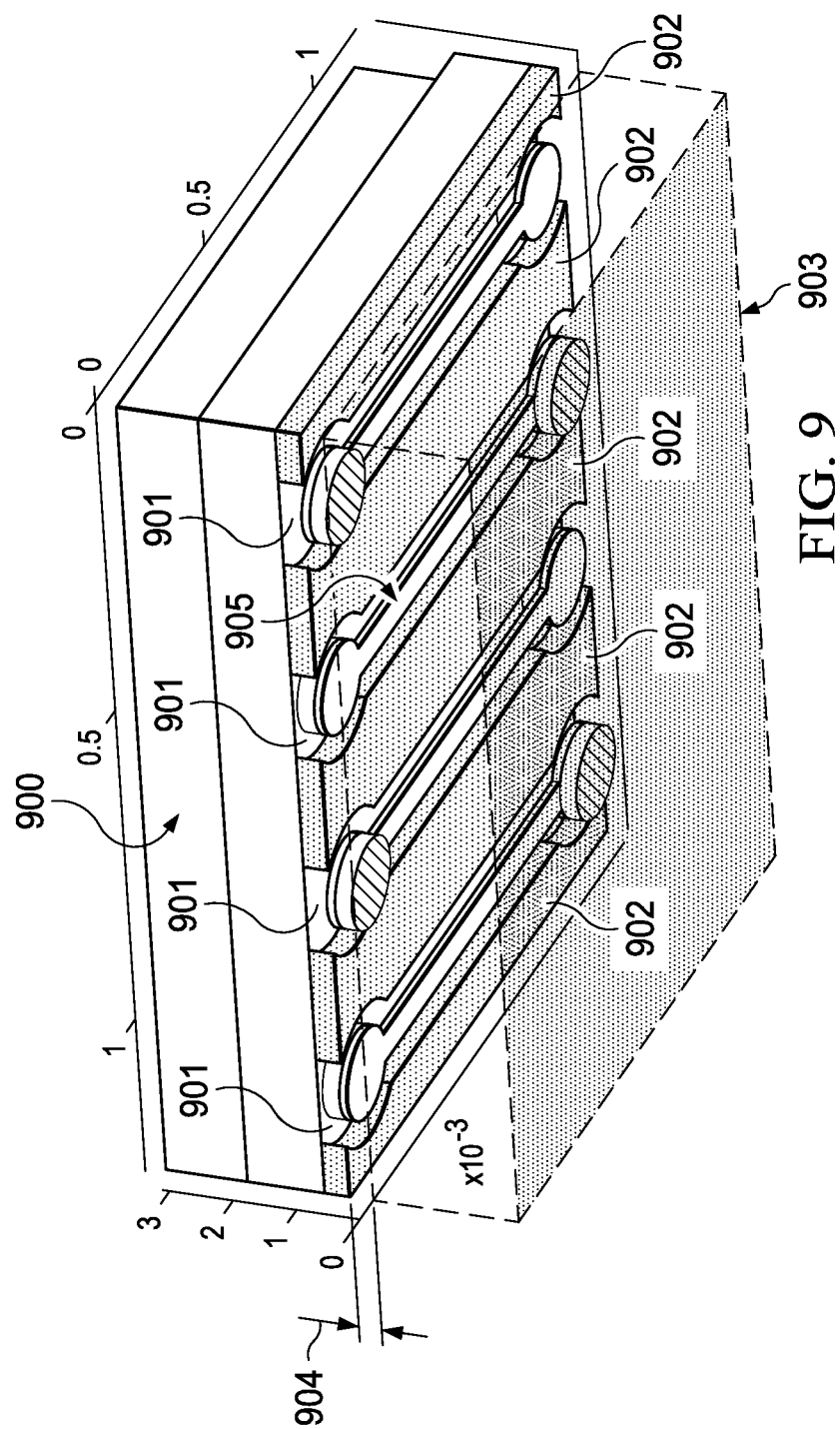
FIG. 9 is a quarter model of example configuration of springs and viscous dampers.
Figure 10A:
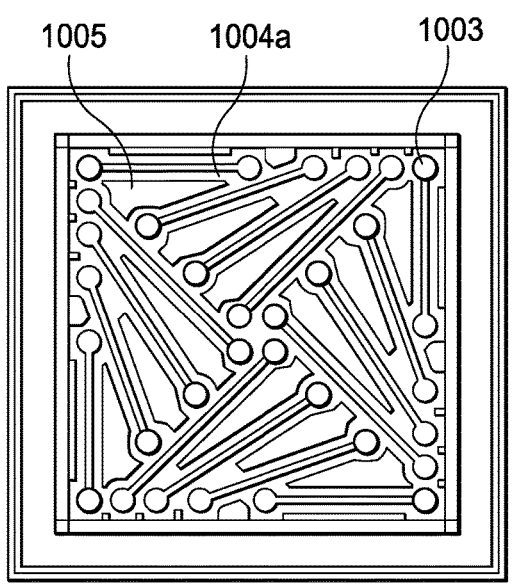
FIGS. 10A-10D are examples of metal spring and viscous damper designs that meet the design goal on mechanical resonant frequency and Q.
Figure 10B:
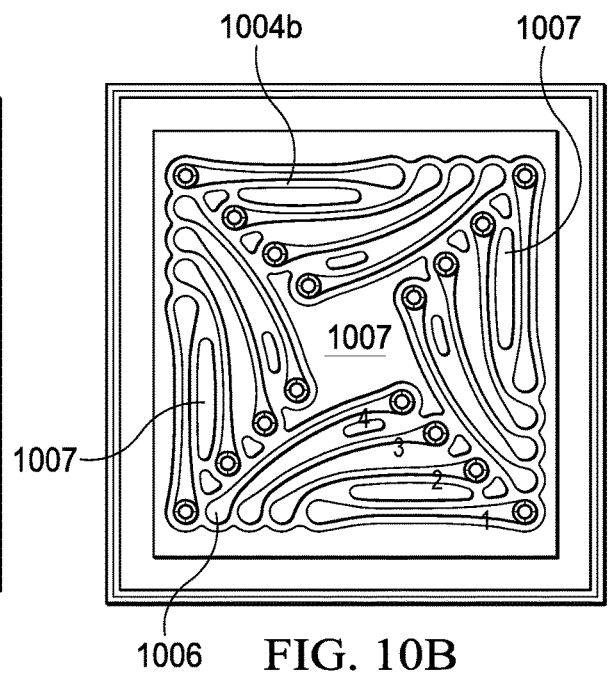
Figure 10C:
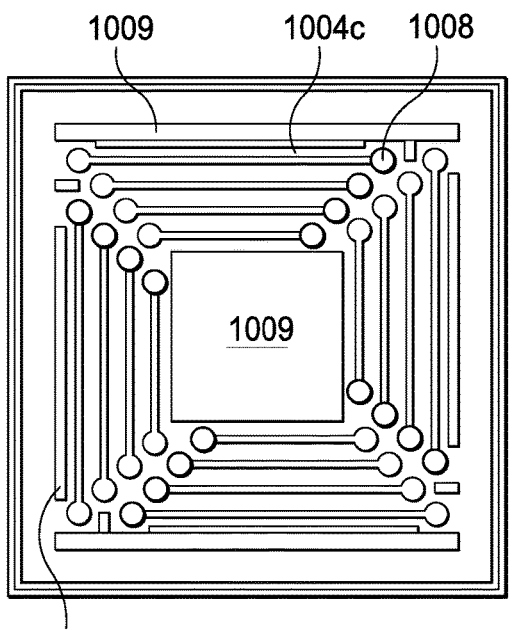
Figure 10D:
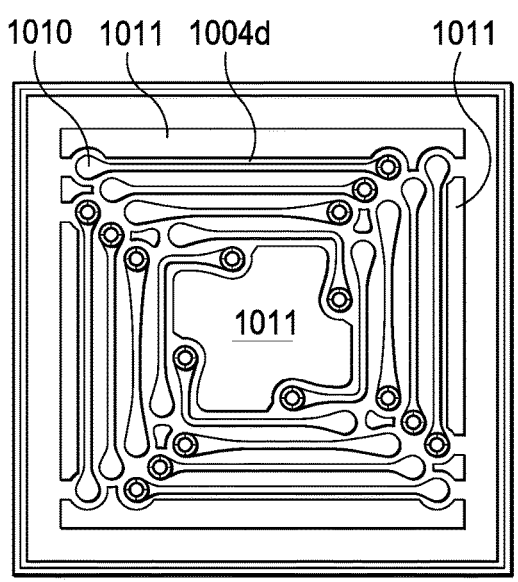

FIG. 9 shows an example of the spring and viscous damper design in a quarter model. In this example, viscous dampers 902 are attached to the bottom side of sensor stack 900, creating small vertical gaps 904 to the substrate 903 and channels 901 around metal springs 905. In some implementations, as shown in FIG. 8, viscous dampers 802 can be attached to the side of substrate 801, creating vertical gaps 811 to the bottom side of sensor stack 806-808.

FIGS. 10A-10D are examples of viscous damper configurations that meet the design goal for mechanical resonant frequency and quality factor Q. Full design examples of metal spring and viscous dampers are shown in FIGS. 10A-10D which take into consideration state-of-art motion sensor silicon dimensions as the device to be vibration isolated. The design goal is to achieve a mechanical suspension system with an overall resonant frequency to be in the range of about 500 Hz to about 1 kHz and low quality factor Q (e.g., less than 1.0) for a better low-pass filtering effect. The design and location of the viscous dampers determine the damping coefficient as well as the quality factor Q and, together with the design and number of metal springs, define the overall stiffness and resonant frequency of the mechanical suspension system.

Referring to FIGS. 10A-10D, different viscous damper configurations are presented based on the geometry of metal springs to create channels 1004a-1004d (between spring and viscous dampers or between springs) and gaps (between viscous dampers and the sensor stack). Channels 1004a-1004d will increase the travel length of the air, gas or liquid during sensor motion and therefore increases the viscous drag. Viscous dampers 1005, 1007, 1009 and 1011 create small gaps in the direction of sensor motion that needs to be damped out. Small gaps enhance the air damping through squeeze-film and slide-film damping effects.

Figure 11A:
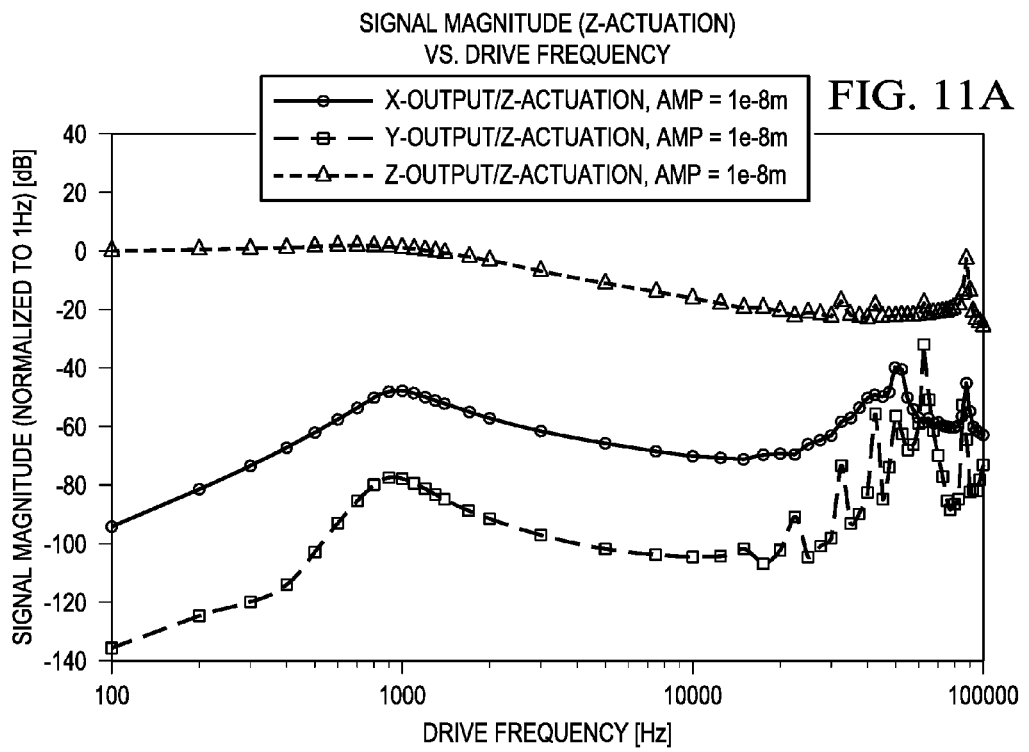
FIGS. 11A and 11B are example simulated frequency responses of the mechanical suspension system.

FIG. 11A is an example simulated frequency response of a metal spring suspension using viscous dampers, showing a resonant frequency at about 700 Hz and a quality factor Q of about 1.3. The simulation shows that a metal spring suspension system using viscous damping (e.g., air damping) can achieve the design goal for resonant frequency and quality factor Q.

Figure 11B:
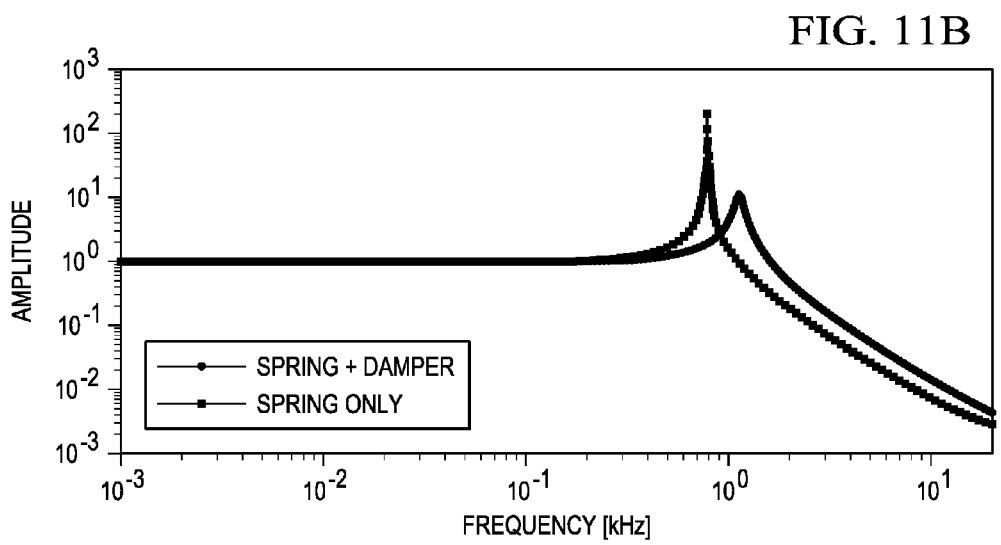

FIG. 11B shows an example simulated frequency response for another spring design using mechanically compliant dampers, together with a frequency response when no mechanically compliant dampers are used (e.g., metal springs only). The mechanical suspension system with only the metal springs has a resonant frequency at about 786 Hz. When the damper is incorporated, the vibration amplitude is greatly attenuated showing a Q of about 11.6. The resonant frequency, however, increases to about 1131 Hz, which is a design tradeoff when incorporating mechanically compliant dampers. In some implementations, mechanically compliant dampers can be used together with viscous dampers to achieve desired damping.

FIGS. 12A-12I are cross-section views of a process flow to fabricate a mechanical suspension system with viscous dampers, described in reference to FIGS. 8-11.

Figure 12A:
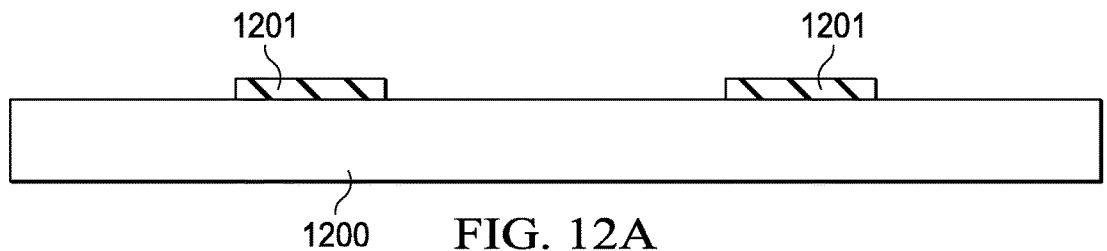
FIGS. 12A-12I are cross-section views of a process flow to fabricate the mechanical suspension system with viscous dampers.

Referring to FIG. 12A, the package begins with a flat surface. In the example shown, the flat surface is provided general package substrate 1200. In other embodiments, the flat surface can be provided by a silicon wafer. A sacrificial material 1201 is deposited with a defined thickness and pattern.

Figure 12B:
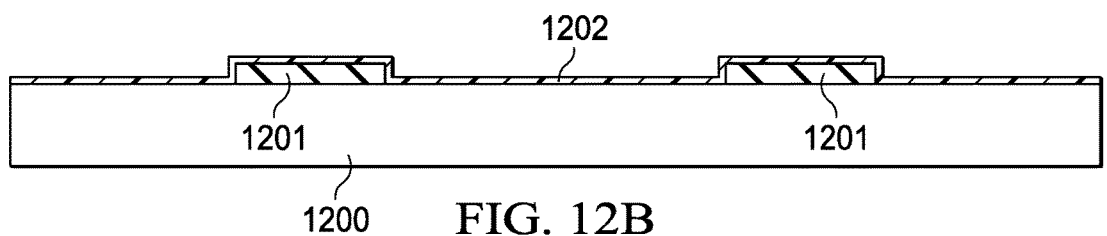

Referring to FIG. 12B, thin seed layer 1202 is deposited by physical vapor deposition (PVD) onto the surface of substrate 1200 and sacrificial layer 1201.

Figure 12C:
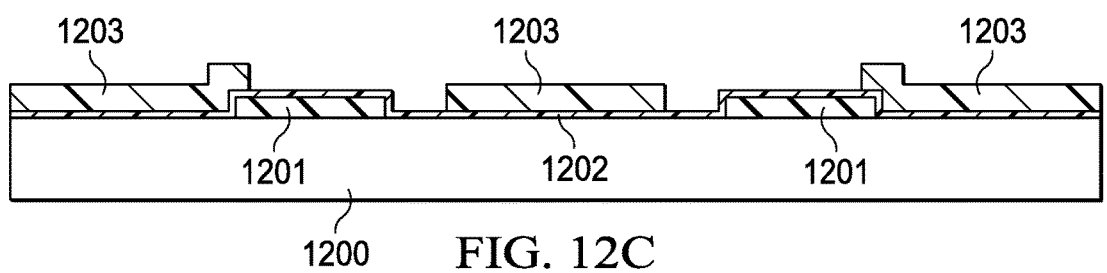

Referring to FIG. 12C, first photoresist layer 1203 is deposited onto seed layer 1202. First photoresist layer 1203 is patterned by photolithography technology to define a metal spring pattern.

Figure 12D:
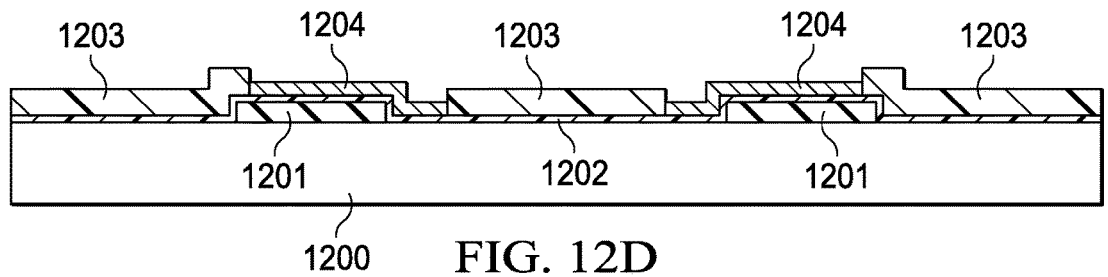
Figure 12E:
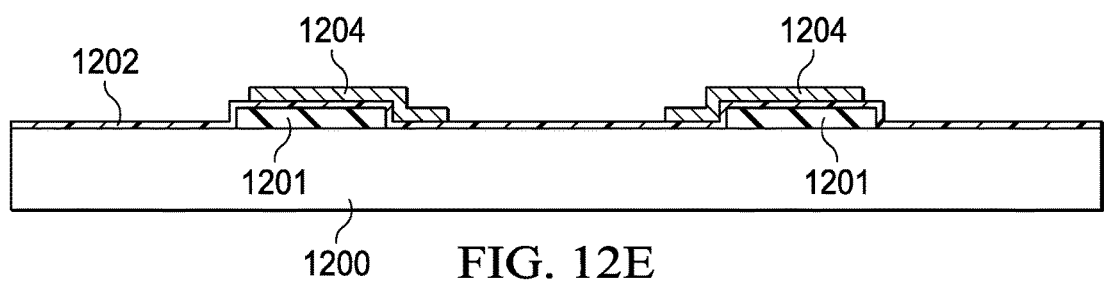

Referring to FIG. 12D, a first metal layer of defined thickness is electrode-plated onto seed layer 1202 to form metal springs 1204 and first photoresist layer 1203 is removed by chemical etching, as shown in FIG. 12E.

Figure 12F:
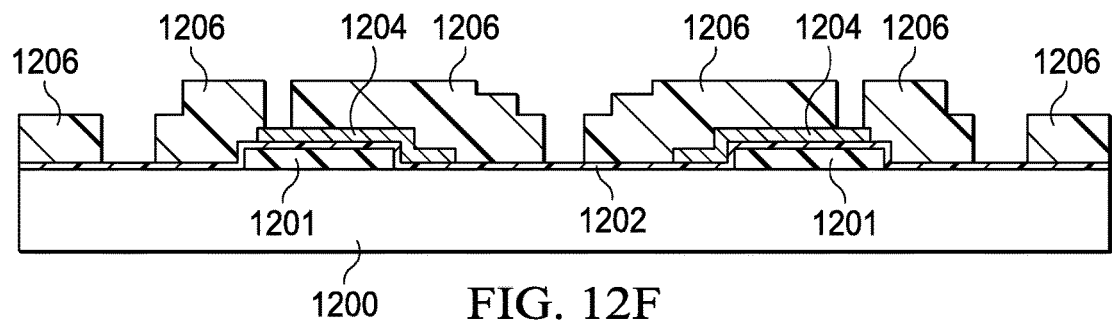

Referring to FIG. 12F, second photoresist layer 1206 is deposited onto seed layer 1202 and metal springs 1204. Second photoresist layer 1206 is patterned by photolithography technology to define a sequential viscous damper pattern.

Figure 12G:
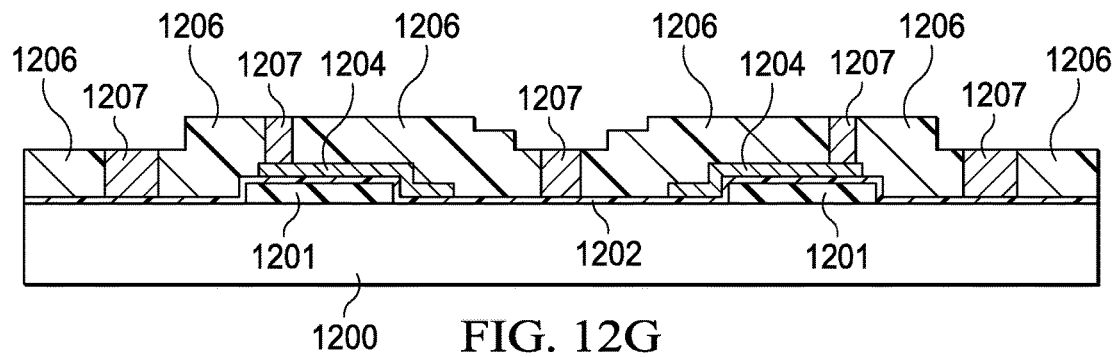
Figure 12H:
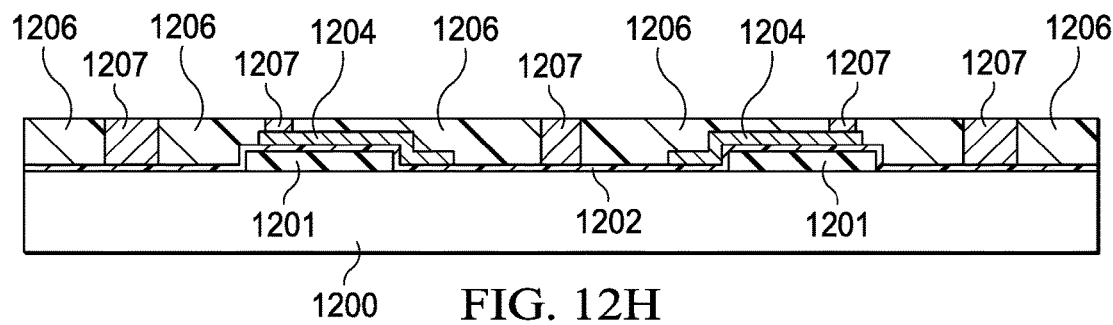

Referring to FIG. 12G, a second metal layer of a second defined thickness is electrode-plated on to seed layer 1202 to form viscous dampers 1207. A substantially flat top surface is created on the resulting structure by grinding or milling the top surface of the structure as shown in FIG. 12H.

Figure 12I:
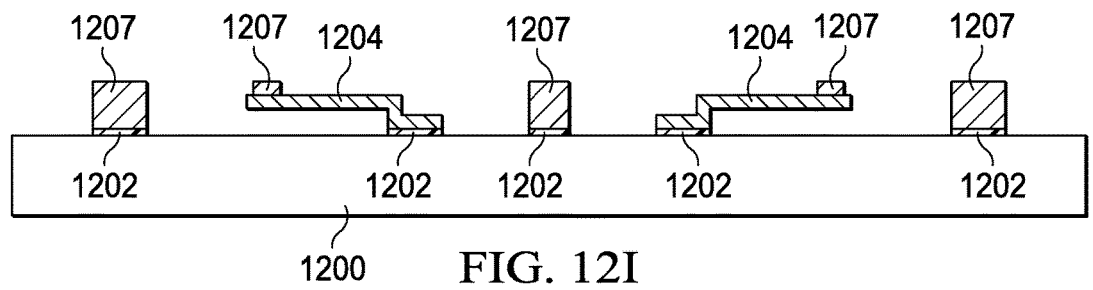

Referring to FIG. 12I, second photoresist layer 1206 is removed by chemical etching and seed layer 1202 is removed by sputtering or chemical etching. Lastly, sacrificial layer 1201 is removed to release metal springs 1204.

As described herein, a mechanical low pass filter for motion sensors can provide out-of-band vibration attenuation as well as package strain isolation. The mechanical suspension structure can be made from any material that can be deposited with thin-film deposition technology. The materials include but are not limited to: copper, copper alloy, aluminum, aluminum alloy, iron, silicon, nickel and nickel alloy. The mechanical suspension system utilizes mechanically compliant dampers and/or viscous dampers to further attenuate the resonance behavior of the mechanical filter. The basic structure design for the mechanical filter can be manufactured in a sensor package.

While this document contains many specific implementation details, these details should not be construed as limitations on the scope of what may be claimed but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A motion sensor package comprising:
 a substrate;
 a plurality of viscous dampers formed on a first side surface of the substrate;
 one or more mechanically compliant springs, each having a first portion formed on the first side surface of the substrate; and
 a sensor stack overlying the plurality of viscous dampers and the one or more mechanically compliant springs,
 wherein each of the one or more mechanically compliant springs has a second portion protruding from a side surface of at least one of the plurality of viscous dampers and attached to a first side surface of the sensor stack and a third portion embedded within the at least one of the plurality of viscous dampers, the first side surface of the substrate faces the first side surface of the sensor stack,
 wherein a gap is provided between the first side surface of the sensor stack and a top surface of the plurality of viscous dampers, and channels are provided between the plurality of viscous dampers and the mechanically compliant springs, and
 wherein the one or more mechanically compliant springs and the plurality of viscous dampers provide a mechanical suspension system having a resonant frequency that is higher than a sensing bandwidth of a motion sensor in the sensor stack and lower than a resonant frequency of the motion sensor.

2. The motion sensor package of claim 1, wherein the gap and the channels are filled with at least one of air, gas, or liquid.

3. The motion sensor package of claim 1, wherein a height of the gap, a surface area and a roughness between the plurality of viscous dampers and the sensor stack, and a width and a length of the channels determine a damping coefficient of the mechanical suspension system.

4. The motion sensor package of claim 1, wherein the one or more mechanically compliant springs determine a stiffness of the mechanical suspension system.

5. The motion sensor package of claim 1, wherein the motion sensor package is hermetically sealed, and the gap and the channels formed by the plurality of viscous dampers are filled with an air, gas, or liquid at a pressure determined at least in part by a sealing pressure.

6. The motion sensor package of claim 1, wherein the gap formed between the sensor stack and the plurality of viscous dampers extends in a direction of motion to be dampened.

7. The motion sensor package of claim 1, wherein the channels are at least partially surrounding the one or more mechanically compliant springs.

8. The motion sensor package of claim 1, wherein the one or more mechanically compliant springs electrically couple the substrate to the sensor stack.

9. The motion sensor package of claim 1, wherein the sensor stack comprises:
 an integrated circuit die attached to the one or more mechanically compliant springs; and
 the motion sensor attached to the integrated circuit die.

10. The motion sensor package of claim 9, wherein the one or more mechanically compliant springs are attached to the integrated circuit die with at least one of solder, conductive epoxy, or silicone.

11. The motion sensor package of claim 9, wherein the motion sensor is a micro-electro-mechanical system (MEMS).

12. The motion sensor package of claim 1, wherein the third portion is positioned between the first portion and the second portion.

13. An apparatus comprising:
 a motion sensor including:
  a substrate;
  a plurality of viscous dampers formed on a first side surface of the substrate;
  one or more mechanically compliant springs, each having a first portion formed on the first side surface of the substrate; and
  a sensor stack overlying the plurality of viscous dampers and the one or more mechanically compliant springs,
  wherein each of the one or more mechanically compliant springs has a second portion protruding from a side surface of at least one of the plurality of viscous dampers and attached to a first side surface of the sensor stack and a third portion embedded within the at least one of the plurality of viscous dampers, the first side surface of the substrate faces the first side surface of the sensor stack,
  wherein a gap is provided between the first side surface of the sensor stack and a top surface of the plurality of viscous dampers, and channels are provided between the plurality of viscous dampers and the mechanically compliant springs, and
  wherein the one or more mechanically compliant springs and the plurality of viscous dampers provide a mechanical suspension system having a resonant frequency that is higher than a sensing bandwidth of a motion sensor in the sensor stack and lower than a resonant frequency of the motion sensor;
 a processor coupled to the motion sensor;
 memory coupled to the processor and configured to store instructions, which when executed by the processor, cause the processor to perform operations comprising:

obtaining a motion signal from the motion sensor; and determining one or more of position, velocity, speed or orientation of the apparatus based at least in part on the motion signal.

14. The apparatus of claim 13, wherein the gap and the channels are filled with at least one of air, gas, or liquid.

15. The apparatus of claim 13, wherein a height of the gap, a surface area and a roughness between the plurality of viscous dampers and the sensor stack, and a width and a length of the channels determine a damping coefficient of the mechanical suspension system.

16. The apparatus of claim 13, wherein the one or more mechanically compliant springs determine a stiffness of the mechanical suspension system.

17. The apparatus of claim 13, wherein the motion sensor package is hermetically sealed, and the gap and the channels formed by the plurality of viscous dampers are filled with an air, gas, or liquid at a pressure determined at least in part by a sealing pressure.

18. The apparatus of claim 13, wherein the third portion is positioned between the first portion and the second portion.

* * * * *